(12) United States Patent
Won

(10) Patent No.: US 7,338,879 B2
(45) Date of Patent: Mar. 4, 2008

(54) METHOD OF FABRICATING A SEMICONDUCTOR DEVICE HAVING DUAL STACKED MIM CAPACITOR

(75) Inventor: Seok-Jun Won, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/649,830

(22) Filed: Jan. 5, 2007

(65) Prior Publication Data

US 2007/0111496 A1     May 17, 2007

Related U.S. Application Data

(62) Division of application No. 11/047,817, filed on Feb. 2, 2005, now Pat. No. 7,180,120.

(30) Foreign Application Priority Data

Feb. 4, 2004    (KR) ................... 2004-7362

(51) Int. Cl.
*H01L 21/20* (2006.01)

(52) U.S. Cl. .................... 438/396; 438/399

(58) Field of Classification Search ........... 438/239, 438/250, 253, 256, 381, 393, 396, 399
See application file for complete search history.

(56) References Cited

U.S. PATENT DOCUMENTS

| | | | |
|---|---|---|---|
| 5,446,311 A | 8/1995 | Ewen et al. | |
| 6,166,423 A | 12/2000 | Gambino et al. | |
| 6,274,435 B1 * | 8/2001 | Chen | 438/267 |
| 6,337,496 B2 * | 1/2002 | Jung | 257/295 |
| 6,337,517 B1 | 1/2002 | Ohta et al. | |
| 6,384,442 B1 | 5/2002 | Chen | |
| 6,387,775 B1 | 5/2002 | Jang et al. | |
| 6,391,713 B1 | 5/2002 | Hsue et al. | |
| 6,404,001 B2 | 6/2002 | Koo et al. | |
| 6,680,521 B1 | 1/2004 | Kar-Roy et al. | |
| 6,815,328 B2 | 11/2004 | Pio | |
| 6,838,717 B1 | 1/2005 | Yen et al. | |
| 6,891,218 B2 | 5/2005 | Kiyotoshi | |
| 6,933,551 B1 | 8/2005 | Stribley et al. | |
| 2001/0019144 A1 * | 9/2001 | Roy | 257/296 |
| 2001/0042867 A1 | 11/2001 | Furuhata | |
| 2002/0056869 A1 * | 5/2002 | Morimoto | 257/313 |
| 2002/0071237 A1 * | 6/2002 | Adler | 361/302 |
| 2002/0086492 A1 * | 7/2002 | Tsau | 438/396 |
| 2003/0197215 A1 | 10/2003 | Coolbaugh et al. | |
| 2004/0079980 A1 | 4/2004 | Hieda | |
| 2004/0152258 A1 | 8/2004 | Kiyotoshi | |
| 2004/0180508 A1 * | 9/2004 | Park | 438/393 |
| 2004/0207043 A1 | 10/2004 | Matsunaga et al. | |

(Continued)

*Primary Examiner*—Zandra V. Smith
*Assistant Examiner*—Toniae M Thomas
(74) *Attorney, Agent, or Firm*—Volentine & Whitt, PLLC

(57) ABSTRACT

Semiconductor devices having a dual stacked MIM capacitor and methods of fabricating the same are disclosed. The semiconductor device includes a dual stacked MIM capacitor formed on the semiconductor substrate. The dual stacked MIM capacitor includes a lower plate positioned, an upper plate electrically connected to the lower plate and positioned above the lower plate, and an intermediate plate interposed between the lower plate and the upper plate. An upper interconnection line is positioned at the same level as the upper plate. The upper interconnection line is electrically connected to the intermediate plate. As a result, the upper plate may be formed by a damascene process.

8 Claims, 15 Drawing Sheets

U.S. PATENT DOCUMENTS

| | | | |
|---|---|---|---|
| 2004/0256654 A1* | 12/2004 | Korner et al. | 257/306 |
| 2005/0006771 A1* | 1/2005 | Akiyama | 257/758 |
| 2005/0082592 A1* | 4/2005 | Chang et al. | 257/306 |
| 2005/0121744 A1 | 6/2005 | Chang et al. | |
| 2006/0145293 A1* | 7/2006 | Cho | 257/532 |
| 2006/0214265 A1* | 9/2006 | Goebel et al. | 257/533 |

* cited by examiner

METHOD OF FABRICATING A SEMICONDUCTOR DEVICE HAVING DUAL STACKED MIM CAPACITOR

CROSS-REFERENCE TO RELATED APPLICATIONS

This is a divisional of application Ser. No. 11/047,817, filed Feb. 2, 2005 now U.S. Pat. No. 7,180,120, the subject matter of which is hereby incorporated by reference in its entirety.

BACKGROUND OF THE INVENTION

1. Field of the Invention

The present invention generally relates to semiconductor devices and methods of fabricating the same. More particularly, the present invention generally relates to semiconductor devices having a dual stacked MIM capacitor and methods of fabricating the same.

2. Description of the Related Art

In general, it is easy to control the capacitance for a Metal-Insulator-Metal (MIM) capacitor, because changes in its capacitance due to voltage and frequency fluctuations are small as compared to a poly-insulator-poly (PIP) capacitor. Therefore, the MIM capacitor is widely used for applications such as an analog to digital (AD) converter, an RF device, a switching capacitor filter, and a CMOS image sensor (CIS).

As semiconductor devices have become highly integrated, a MIM capacitor having a higher capacitance per unit of chip area is required. A semiconductor device having a dual stacked MIM capacitor, wherein the capacitor has a high capacitance per unit of chip area has been proposed.

US Patent Publication No. 2003/0197215 (A1) discloses one method of fabricating a semiconductor device having the dual stacked MIM capacitor.

This method discloses forming a stacked layer having a top metal layer, an intermediate metal layer, and a bottom metal layer. The top metal layer is patterned to form a metal plate associated with a first MIM capacitor, the intermediate metal layer is patterned to form metal plates associated with the first and a second MIM capacitors, and the bottom metal layer is patterned to form a metal plate associated with the second MIM capacitor. A via formed in contact with the patterned intermediate metal layer and at least two vias formed in contact with the patterned top metal layer and the patterned bottom metal layer are formed, wherein the at least two vias are electrically connected to each other.

According to this method, a dual stacked MIM capacitor may be fabricated to ensure a high capacitance per unit of chip area. However, each of the top metal layer, the intermediate metal layer, and the bottom metal layer is patterned using separate photolithography and etching processes. As a result, at least three photomasks are required to pattern these metal layers.

SUMMARY OF THE INVENTION

The present invention provides a semiconductor device including a semiconductor substrate, a dual stacked MIM capacitor having a lower plate disposed above the semiconductor substrate, an upper plate electrically connected to the lower plate and disposed above the lower plate, and an intermediate plate interposed between the lower plate and the upper plate, and a first upper interconnection line positioned at the same level as the upper plate and electrically connected to the intermediate plate.

The present invention also discloses a method of manufacturing a semiconductor device having a dual stacked MIM capacitor by forming a lower insulating layer a semiconductor substrate, forming a patterned lower plate and a lower interconnection line on the lower insulating layer, forming an patterned intermediate plate comprising a first intermediate plate conductive layer, a second intermediate plate conductive layer, and a third intermediate plate conductive layer, sequentially forming an etch stop layer and an upper insulating layer on the patterned intermediate plate, patterning the upper insulating layer to form a plurality of trenches, forming a first via hole to expose the patterned lower plate, a second via hole to expose the patterned intermediate plate, and a third via hole to expose the lower interconnection line, and filling the plurality of trenches and via holes with a conductive material, thereby forming a patterned upper plate electrically connected to the patterned lower plate, a patterned first upper interconnection line electrically connected to the patterned intermediate plate, and a patterned second interconnection line electrically connected to the lower connection line.

Also disclosed is a method of forming a lower insulating layer on a semiconductor substrate, forming a patterned lower plate and a lower interconnection line on the lower insulating layer, forming a patterned intermediate plate comprising a first intermediate plate conductive layer, a second intermediate plate conductive layer, and a third intermediate plate conductive layer, forming a spacer on sidewalls of the patterned intermediate plate, sequentially forming an etch stop layer and an upper insulating layer on the patterned intermediate plate, patterning the upper insulating layer to form a plurality of trenches, forming a first via hole to expose the patterned lower plate, a second via hole to expose the patterned intermediate plate, and a third via hole to expose the lower interconnection line, and filling the plurality of trenches and via holes with a conductive material, thereby forming a patterned upper plate electrically connected to the patterned lower plate, a patterned first upper interconnection line electrically connected to the patterned intermediate plate, and a patterned second interconnection line electrically connected to the lower connection line.

BRIEF DESCRIPTION OF THE DRAWINGS

Aspects of the present invention will be apparent from the detailed description of the present invention in view of the accompanying drawings. The drawing is not necessarily to scale, emphasis instead being placed upon illustrating the principles of the invention.

DETAILED DESCRIPTION OF THE INVENTION

The present invention will now be described more fully hereinafter with reference to the accompanying drawings, in which exemplary embodiments of the invention are shown. It will be understood that when an element such as a layer, a region or a substrate is referred to as being "on" or "onto" another element, it can be directly on the other element or intervening elements may also be present.

Figure 1:
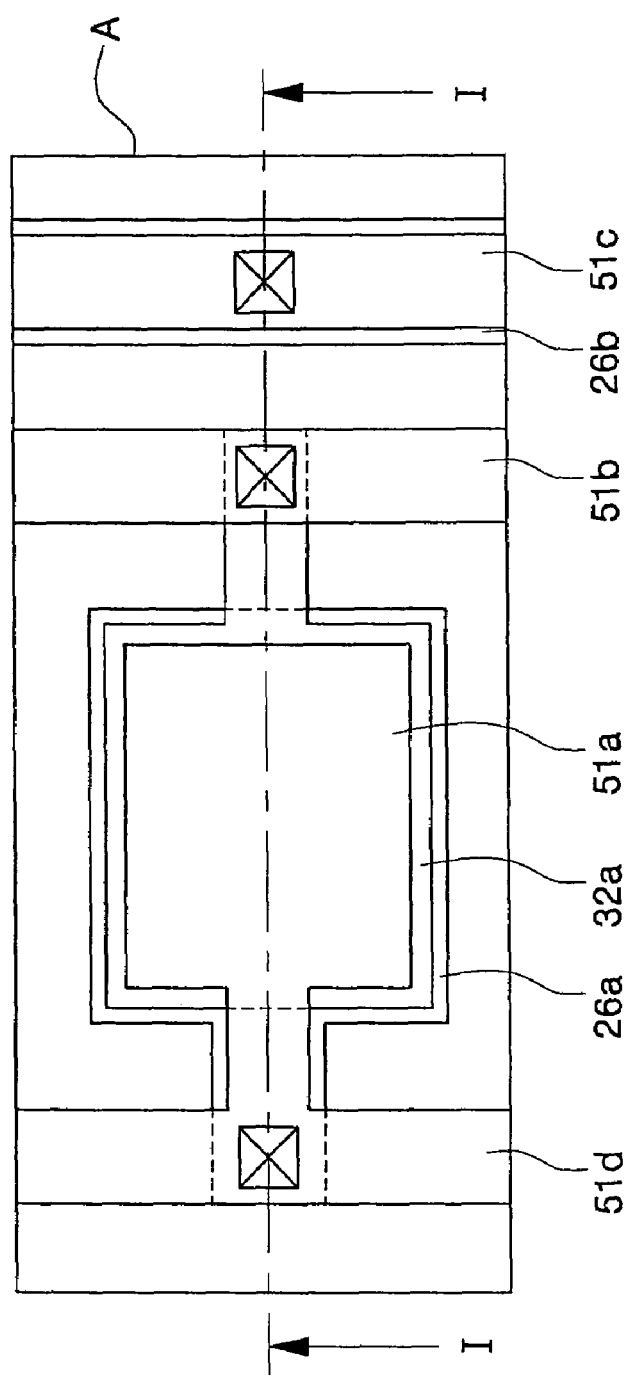
FIG. 1 is a layout of a semiconductor device having a dual stacked MIM capacitor in accordance with an exemplary embodiment of the present invention.

Reference "A" in FIG. 1 indicates a predetermined region of an upper portion of a semiconductor substrate having a dual stacked MIM capacitor region.

Figure 8:
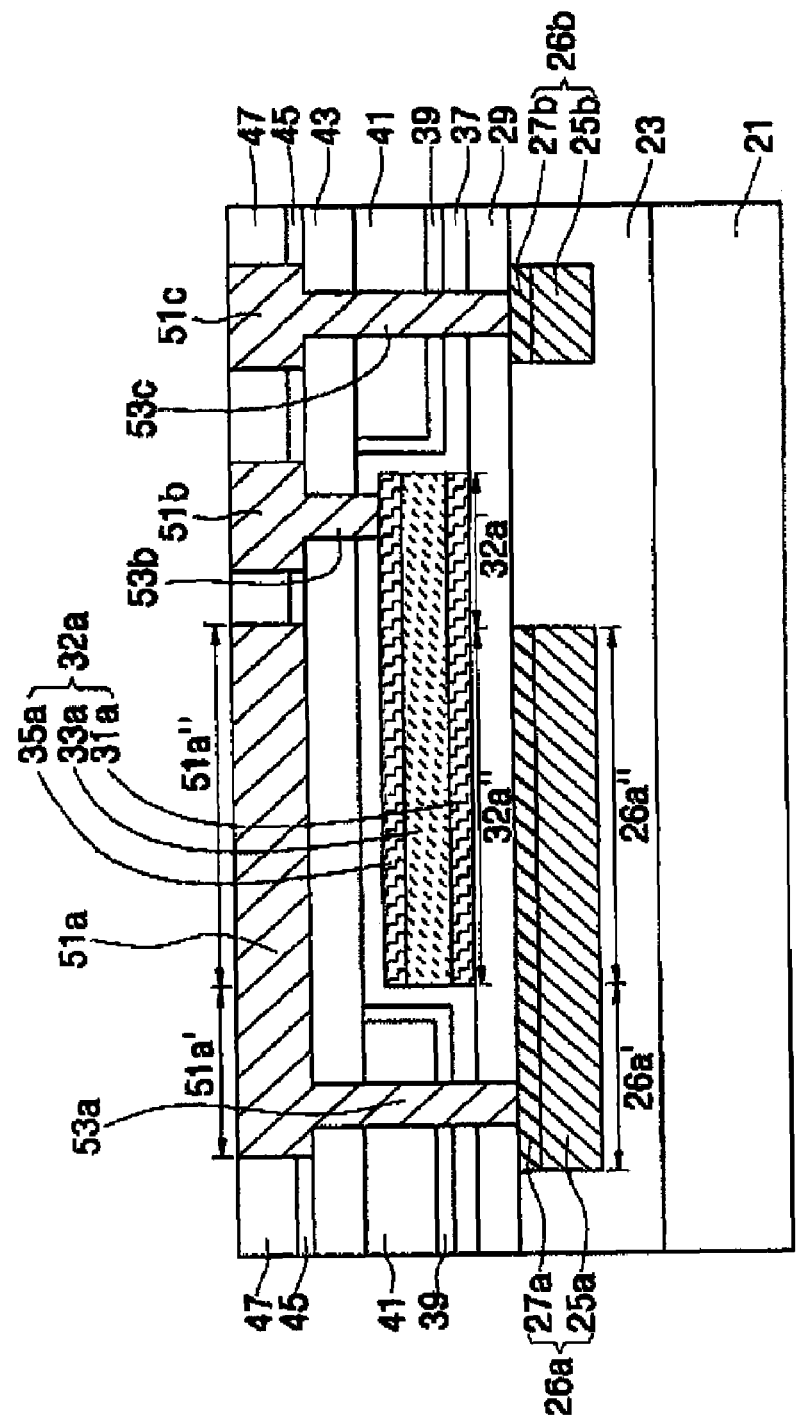

Referring to FIG. 1 and FIG. 8, a patterned lower plate 26a is disposed on a semiconductor substrate 21. The patterned lower plate 26a includes a lower plate 26a". In addition, patterned lower plate 26a may include a first connecting portion 26a' electrically connected to the lower plate 26a". A lower interconnection line 26b is disposed at the same level as patterned lower plate 26a on semiconductor substrate 21. A lower insulating layer 23 insulates patterned lower plate 26a and lower interconnection line 26b. In addition, insulating layer 23 is interposed between semiconductor substrate 21, and patterned lower plate 26a and lower interconnection line 26b.

Patterned lower plate 26a and lower interconnection line 26b are formed of the same material such as W, Al, or Cu. In addition, barrier metal layers 27a and 27b are disposed at an upper portion of patterned lower plate 26a and lower interconnection line 26b, respectively. Barrier metal layers 27a and 27b prevent metal atoms from metal layers 25a and 25b from diffusing into layers subsequently formed on patterned lower plate 26a and lower interconnection line 26b. For example, if metal layers 25a and 25b are Cu, barrier metal layers 27a and 27b may be formed from a metal nitride layer such as TIN, TaN or WN, a ternary compound layer containing Si or Al such as TaSiN or TaAlN, a noble metal layer such as Ir, Pt or Ru, or similar layer such as Ti or Ta.

A patterned upper plate 51a is positioned above patterned lower plate 26a. Patterned upper plate 51a includes an upper plate 51a". In addition, a first upper interconnection line 51b is positioned at the same level as patterned upper plate 51a. Furthermore, a second upper interconnection line 51c is formed apart from first upper interconnection line 51b, but formed at the same level as first upper interconnection line 51b. Second upper interconnection line 51c is positioned above lower interconnection line 26b. First patterned upper plate 51a, first upper interconnection line 51b, and second upper interconnection line 51c are preferably insulated from one another by an upper insulating layer 47 and an etch-stop layer 45.

A patterned intermediate plate 32a is disposed between patterned lower plate 26a and patterned upper plate 51a. Patterned intermediate plate 32a includes an intermediate plate 32a" interposed between lower plate 26a" and upper plate 51 a". Patterned intermediate plate 32a is a stacked layer of a patterned first intermediate plate 31a, a patterned second intermediate plate 33a, and a patterned third intermediate plate 35a. In addition, patterned intermediate plate 32a may further include a second connecting portion 32a' electrically connected to the intermediate plate 32a". Patterned upper plate 51a may further include a third connecting portion 51a' electrically connected to the upper plate 51 a".

Patterned upper plate 51a, first upper interconnection line 51b, and second upper interconnection line 51c are preferably formed of the same material such as W, Al, or Cu. Patterned second intermediate plate 33a is interposed between patterned first intermediate plate 31a and patterned third intermediate plate 35a. Preferably, each of patterned first and third intermediate plates 31a and 35a is a Ta, Ti, TaN, TIN, WN, or Ru layer. In addition, patterned second intermediate plate 33a is an Al or W layer. As a result, the resistance of the intermediate plate is reduced, which provides a capacitor having excellent operating properties at a high frequency.

A lower dielectric layer 29 is interposed between patterned lower plate 26a and patterned intermediate plate 32a. In addition, first upper dielectric layer 37 and second upper dielectric layer 43 are interposed between patterned intermediate plate 32a and patterned upper plate 51a. Preferably, each of lower dielectric layer 29 and first and second upper dielectric layers 37 and 43 is formed from an oxidation material such as $Al_2O_3$, $HfO_2$, $Ta_2O_5$, $La_2O_3$, $SrTiO_3$(ST), $Ba_xSr_{1-x}TiO_3$, $PbZr_xTi_{1-x}O_3$(PZT), $SrBi_2Ta_2O_5$ or $Zr_2O_3$, silicon nitride (SiN), or an oxynitride.

Lower dielectric layer 29 preferably extends across patterned lower plate 26a and lower interconnection line 26b. First upper dielectric layer 37 preferably extends to cover sidewalls of patterned intermediate plate 32a and lower dielectric layer 29. In addition, second dielectric layer 43 preferably extends to cover the lower portions of patterned upper plate 51a, first upper interconnection fine 51b, and second upper interconnection line 51c. First upper dielectric layer 37 also prevents metal atoms from diffusing from metal layers 25a and 25b. Therefore, if barrier metal layers 27a and 27b and/or lower dielectric layer 29 sufficiently prevent metal atoms from diffusing, first upper dielectric layer 37 may be omitted.

Patterned upper plate 51a and patterned lower plate 26a are electrically connected to each other. Preferably, patterned upper plate 51a and patterned lower plate 26a are electrically connected to each other by a first via 53a, which is formed through first and second upper dielectric layers 31 and 43 and lower dielectric layer 29. A third upper interconnection line 51d may be disposed to cross over the first via 53a. (FIG. 1) Third upper interconnection line 51d may be a power line to apply a voltage to patterned lower and upper plates 26a and 51a. Patterned intermediate plate 32a and first upper interconnection line 51b are electrically connected to each other. Here, first upper interconnection line 51b is a power line to apply voltage to patterned intermediate plate 32a. Preferably, patterned intermediate plate 32a and first upper interconnection line 51b are electrically connected to each other by a second via 53b, which is formed through first and second upper dielectric layers 37 and 43. In addition, lower interconnection line 26b and second upper interconnection line 51c are electrically connected to each other. Here, lower interconnection line 26b and second upper interconnection line 51c are directly and electrically connected to each other by a third via 53c, which is formed through lower dielectric layer 29 and first and second upper dielectric layers 37 and 43. Accordingly, first via 53a is positioned at the same level as third via 53c.

An inter-insulating layer 41 fills empty spaces between patterned upper plate 51a, first upper interconnection line 51b, and second upper interconnection line 51c, and patterned lower plate 26a and lower interconnection line 26b. In addition, a polish stopping layer 39 may be interposed between inter-insulating layer 41 and first upper dielectric layer 37.

Hereinafter, a semiconductor device having a dual stacked MIM capacitor in accordance with another embodiment of the present invention will be described in some additional detail.

Figure 15:
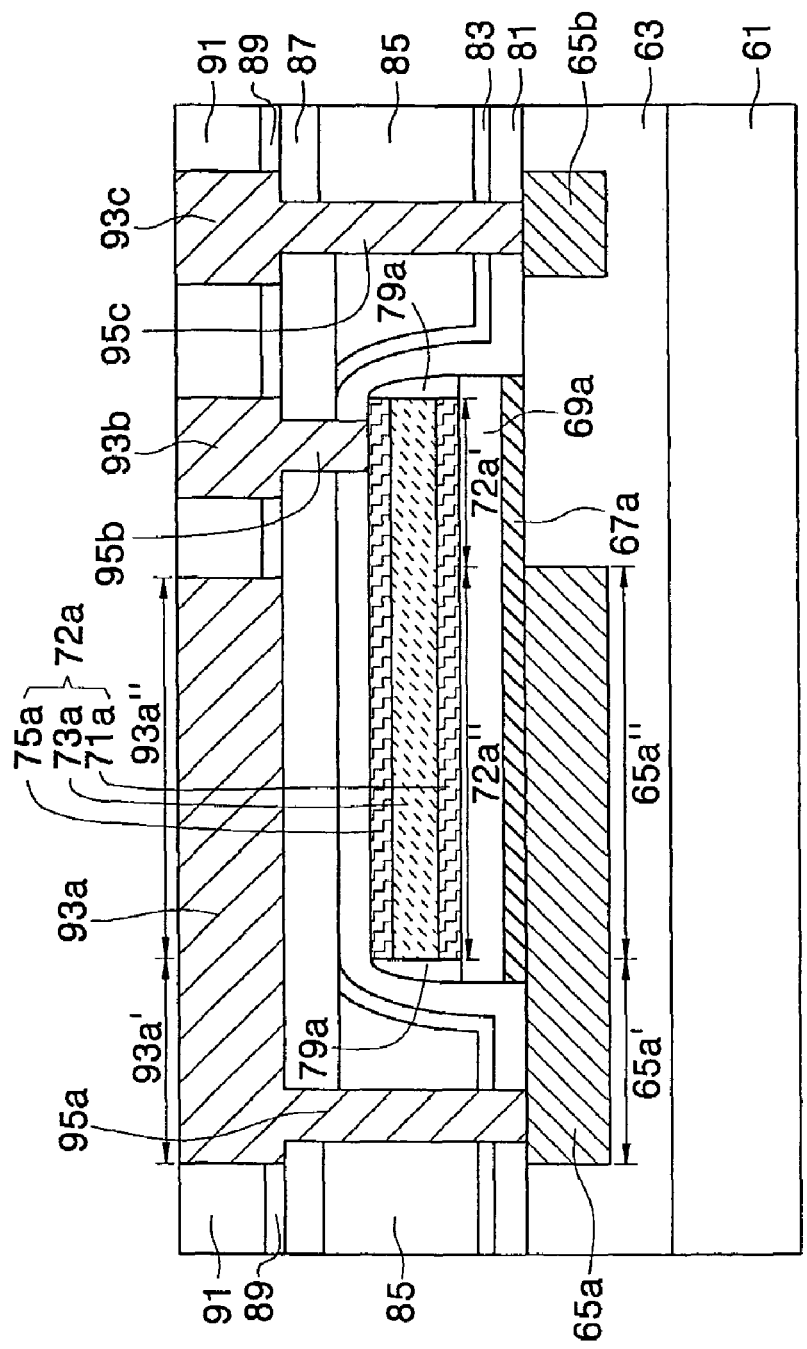

FIG. 15 is a cross-sectional view to illustrate a semiconductor device having a dual stacked MIM capacitor in accordance with another embodiment of the present invention.

Referring to FIG. 15, a patterned lower plate 65a is positioned on a semiconductor substrate 61. Patterned lower plate 65a includes a lower plate 65a". In addition, patterned lower plate 65a may include a first connecting portion 65a' electrically connected to the lower plate 65a". A lower interconnection line 65b is positioned at the same level as patterned lower plate 65a. A lower insulating layer 63 insulates lower interconnection line 65b and patterned lower plate 65a. Furthermore, lower insulating layer 63 is disposed on semiconductor substrate 61. Patterned lower plate 65a and lower interconnection line 65b are formed of the same material, for example, W, Al, or Cu.

A patterned upper plate 93a is positioned above patterned lower plate 65a. Patterned upper plate 93a includes an upper plate 93a". In addition, a first upper interconnection line 93b is positioned at the same level as patterned upper plate 93a. In addition, second upper interconnection line 93c is spaced apart from upper interconnection line 93b and formed to be at the same level as first upper interconnection line 93b. At least some portion of second upper interconnection line 93c is positioned above lower interconnection line 65b. Patterned upper plate 93a, first upper interconnection line 93b, and second upper interconnection line 93c are insulated from one another by an upper insulating layer 91 and an etch-stop layer 89.

A patterned intermediate plate 72a is positioned between patterned lower plate 65a and patterned upper plate 93a. Patterned intermediate plate 72a includes an intermediate plate 72a" interposed between lower plate 65a" and upper plate 93a". Patterned intermediate plate 72a may include a second connecting portion 72a' electrically connected to the intermediate plate 72a". Patterned upper plate 93a may include a third connecting portion 93a' electrically connected to upper plate 93a". Patterned intermediate plate 72a includes patterned first intermediate plate 71a, a patterned second intermediate plate 73a, and a patterned third intermediate plate 75a.

Patterned upper plate 93a, first upper interconnection line 93b, and second upper interconnection line 93c are formed of the same material as described for the first embodiment, i.e., FIG. 8.

A spacer 79a covers sidewalls of patterned intermediate plate 72a. In addition, a patterned lower dielectric layer 69a is interposed between patterned lower plate 65a and patterned intermediate plate 72a. In addition, a patterned barrier metal layer 67a is interposed between patterned lower dielectric layer 69a and patterned lower plate 65a. Patterned lower dielectric layer 69a and patterned barrier metal layer 67a have an extended portion interposed between spacer 79a and semiconductor substrate 61. As a result, when patterned lower dielectric layer 69a is formed using an etching process, properties of a capacitor do not deteriorate due to etch damage caused by patterning patterned lower dielectric layer 69a.

A first upper dielectric layer 81 and a second upper dielectric layer 87 are interposed between patterned intermediate plate 72a and patterned upper plate 93a. As described with reference to FIG. 8, each of patterned lower dielectric layer 69a and first and second upper dielectric layers 81 and 87 are formed from an oxidation material such as $Al_2O_3$, $HfO_2$, $Ta_2O_5$, $La_2O_3$, $SrTiO_3$(ST), $Ba_xSr_{1-x}TiO_3$, $PbZr_xTi_{1-x}O_3$(PZT), $SrBi_2Ta_2O_5$ or $Zr_2O_3$, a silicon nitride (SiN), or an oxynitride.

First upper dielectric layer 81 extends to cover a sidewall of spacer 79a, a sidewall of patterned lower dielectric layer 69a, a sidewall of patterned barrier metal layer 67a, portions of patterned lower plate 65a, and portions of lower interconnection line 65b. In addition, second upper dielectric layer 87 extends to cover a lower portion of patterned upper plate 93a, lower portions of first upper interconnection line 93b, and lower portions of second upper interconnection line 93c. First upper dielectric layer 81 may be omitted.

Patterned upper plate 93a and patterned lower plate 65a are electrically connected to each other. Preferably, patterned upper plate 93a and patterned lower plate 65a are electrically connected to each other by a first via 95a, which is formed through first and second upper dielectric layers 81 and 87. In addition, patterned intermediate plate 72a and first upper interconnection line 93b are electrically connected to each other. Preferably, patterned intermediate plate 72a and upper interconnection line 93b are electrically connected to each other by a second via 95b, which is formed through first and second upper dielectric layers 81 and 87. In addition, lower interconnection line 65b and second upper interconnection line 93c are electrically connected to each other. Here, lower interconnection line 65b and second upper interconnection line 93c are directly and electrically connected to each other by a third via 95c, which is formed through first and second upper dielectric layers 81 and 87. First via 95a is positioned at the same level as the third via 95c.

An inter-insulating layer 85 fills empty spaces between patterned upper plate 93a, first upper interconnection line 93b and second upper interconnection line 93c, and patterned lower plate 65a and lower interconnection line 65b. In addition, a polish stopping layer 83 is interposed between inter-insulating layer 85 and first upper dielectric layer 81.

In the second embodiment, spacer 79a is employed to prevent properties of the capacitor from deteriorating due to the etching damage caused by patterned lower dielectric layer 69a.

Hereinafter, a method of fabricating a dual stacked MIM capacitor in accordance with an exemplary embodiment of the present invention will be described with reference to FIGS. 1-8.

Figure 2:
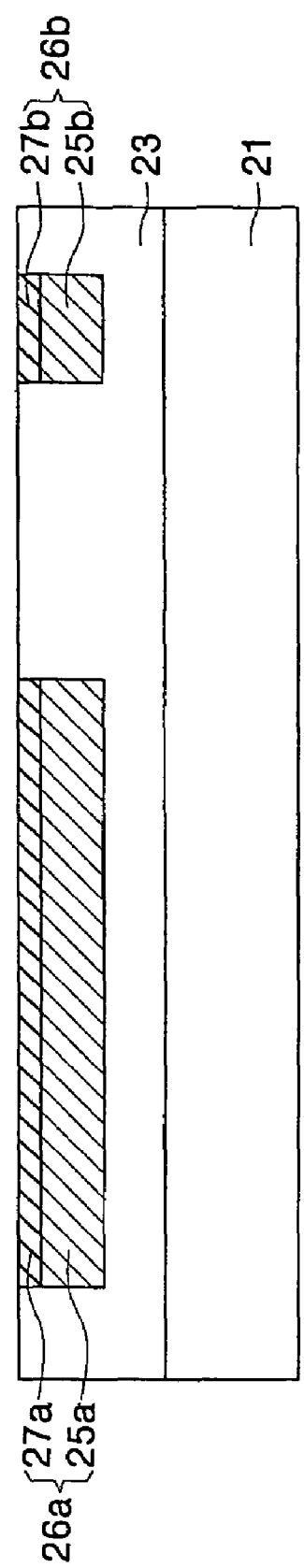
FIGS. 2 to 8 are cross-sectional views taken along line I-I of FIG. 1 to illustrate a method of fabricating a dual stacked MIM capacitor in accordance with exemplary embodiments of the present invention.

Referring to FIG. 1 and FIG. 2, a lower insulating layer 23 is formed on a semiconductor substrate 21. Various elements such as transistors (not shown) or interconnection lines (not shown) may be formed within or on semiconductor substrate 21.

A patterned lower plate 26a and a lower interconnection line 26b are formed within lower insulating layer 23. Patterned lower plate 26a includes a lower plate 26a". In addition, patterned lower plate 26a may include a first connecting portion 26a' electrically connected to the lower plate 26a". Lower interconnection line 26b is spaced apart from patterned lower plate 26a.

Patterned lower plate 26a and lower interconnection line 26b may be formed using a damascene process. Specifically, lower insulating layer 23 is patterned to form trenches, which define patterned lower plate 26a and lower interconnection line 26b. A metal layer is formed to fill the trenches, and then the metal layer is planarized until lower insulating layer 23 is exposed to form metal layers 25a and 25b within the trenches. Barrier metal layer 27a is formed above metal layer 25a to define patterned lower plate 26a, and barrier metal layer 27b is formed above metal layer 25b to define lower interconnection line 26b. Barrier metal layers 27a and 27b may be formed by a selective deposition process. In addition, barrier metal layers 27a and 27b are formed by recessing metal layers 25a and 25b, depositing barrier metal material thereon, and planarizing the barrier metal material. Metal layers 25a and 25b are formed form a metal, such as W, Al, or Cu. Barrier metal layers 27a and 27b may be formed from a metal nitride layer such as TiN, TaN or WN, a ternary compound layer containing Si or Al such as TaSiN or TaAlN, a noble metal layer such as Ir, Pt or Ru, or similar layer such as Ti or Ta.

Alternatively, patterned lower plate 26a and lower interconnection line 26b may be formed using a photolithography process and an etching process. Specifically, after a metal layer is formed on lower insulating layer 23, the metal layer is patterned to form patterned lower plate 26a and lower interconnection line 26b. An insulating layer is then formed on semiconductor substrate 21 having patterned lower plate 26a and lower interconnection line 26b, and planarized to form an insulating layer to insulate patterned lower plate 26a and lower interconnection line 26b.

Figure 3:
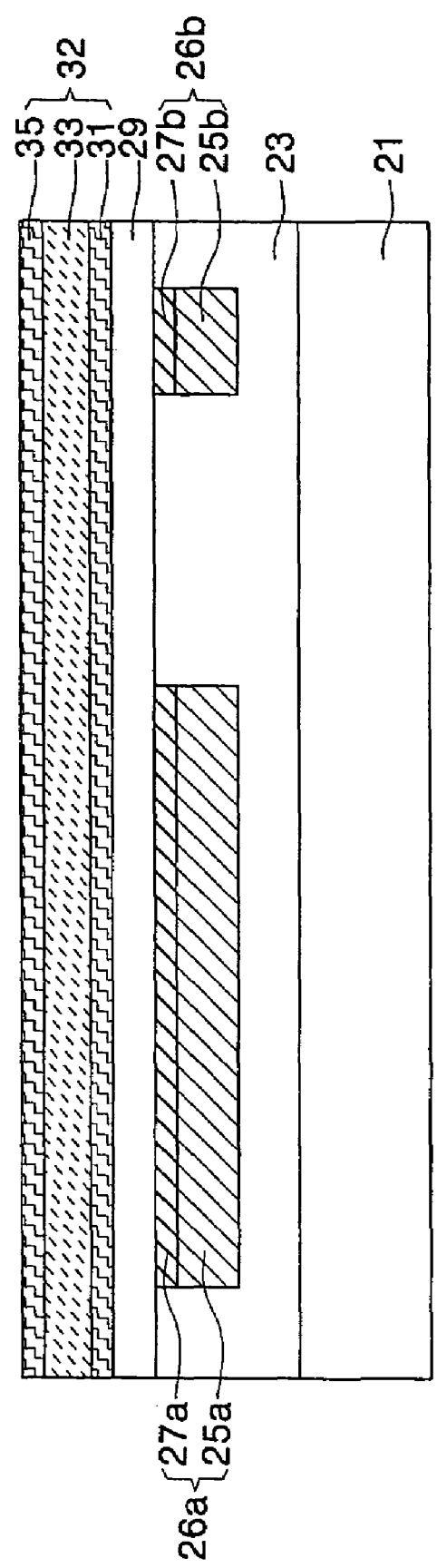

Referring to FIG. 1 and FIG. 3, a lower dielectric layer 29 and an intermediate plate conductive layer 32 are sequentially formed on semiconductor substrate 21 having patterned lower plate 26a and the lower interconnection line 26b. Lower dielectric layer 29 is formed of an oxidation material such as $Al_2O_3$, $HfO_2$, $Ta_2O_5$, $La_2O_3$, $SrTiO_3$(ST), $Ba_xSr_{1-x}TiO_3$, $PbZr_xTi_{1-x}O_3$(PZT), $SrBi_2Ta_2O_5$ or $Zr_2O_3$, silicon nitride (SiN), or oxynitride, and in addition, may be formed of at least two stacked layers. Intermediate plate conductive layer 32 includes a first intermediate plate conductive layer 31, a second intermediate plate conductive layer 33, and a third intermediate plate conductive layer 35, sequentially stacked. Each of first and third intermediate plate conductive layers 31 and 35 is formed from a material such as Ta, Ti, TaN, TiN, WN, or Ru. Second intermediate plate conductive layer 33 is formed from Al or W.

Figure 4:
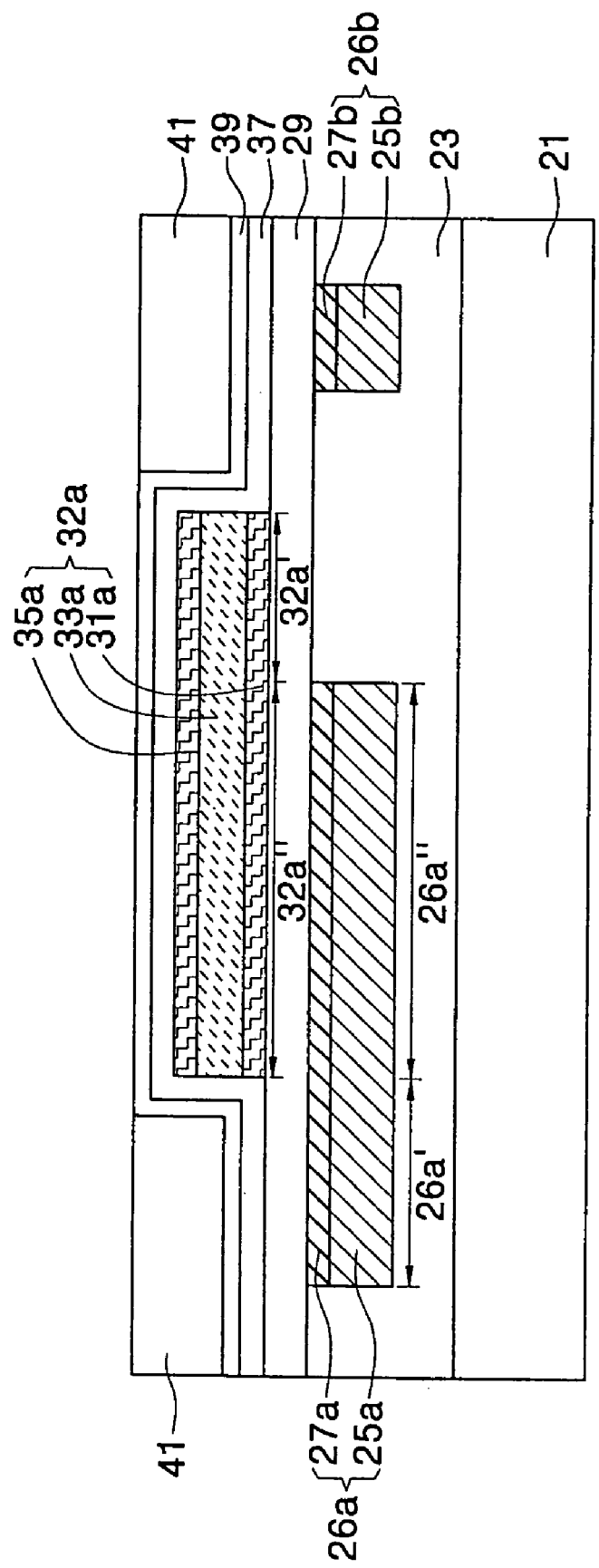

Referring to FIG. 1 and FIG. 4, intermediate plate conductive layer 32 is patterned to form a patterned intermediate plate 32a. Patterned intermediate plate 32a is a stacked structure comprising patterned first through third intermediate plates 31a, 33a, and 35a. Patterned intermediate plate 32a includes an intermediate plate 32a" disposed on lower plate 26a". In addition, patterned intermediate plate 32a may include a second connecting portion 32a' electrically connected to the intermediate plate 32a".

Alternatively, patterned intermediate plate 32a is formed by patterning intermediate plate conductive layer 32 using a photolithography process and an etching process.

After patterned intermediate plate 32a is formed, lower dielectric layer 29 is patterned. Preferably, a spacer (not shown) to cover sidewalls of patterned intermediate plate 32a is formed prior to patterning lower dielectric layer 29. As a result, properties of a capacitor are prevented from deteriorating due to etching damage caused by the formation of lower dielectric layer 29. A method of forming the spacer and a method of patterning lower dielectric layer 29 will be described in reference with FIG. 11 and FIG. 12.

However, returning to FIG. 4, an inter-insulating layer 41 is formed on patterned intermediate plate 32a. Inter-insulating layer 41 is preferably formed from a low-k dielectric material, however, inter-insulating layer 41 may be formed from a material such as silicon dioxide ($SiO_2$) or silicon nitride (SiN). Inter-insulating layer 41 is planarized until a portion of inter-insulating layer 41 above patterned intermediate plate 32a is removed.

Preferably, a first upper dielectric layer 37 is conformably provided prior to the formation of inter-insulating layer 41. First upper dielectric layer 37 covers patterned intermediate plate 32a, and an upper portion of lower dielectric layer 29.

First upper dielectric layer 37 prevents metal atoms from diffusing in patterned lower plate 26a and lower interconnection line 26b into inter-insulating layer 41. When lower dielectric layer 29 is patterned, first upper dielectric layer 37 covers patterned lower plate 26a and lower interconnection line 26b.

A polish stopping layer 39 is preferably formed to cover first upper dielectric layer 37. Polish stopping layer 39 protects an upper surface of first upper dielectric layer 37 when inter-insulating layer 41 is planarized. As a result, polish stopping layer 39 above patterned intermediate plate 32a is exposed after inter-insulating layer 41 is planarized. Preferably, polish stopping layer 39 is an aluminum oxide layer.

Figure 5:
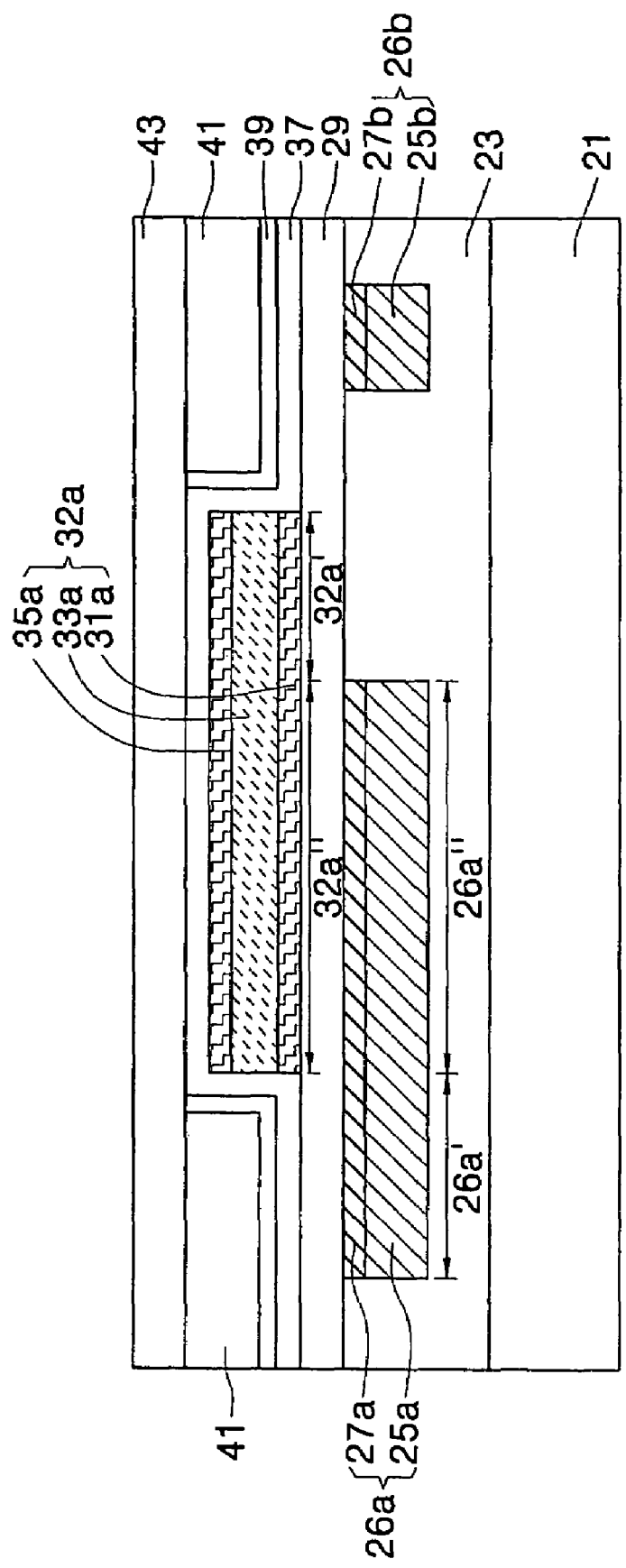

Referring to FIG. 1 and FIG. 5, the exposed polish stopping layer 39 is removed by a wet etching process to expose first upper dielectric layer 37. The exposed first upper dielectric layer 37 may undergo a thermal treatment. The thermal treatment is preferably carried out in an atmosphere containing oxygen atoms or nitrogen atoms, such as $O_2$, $O_2$-plasma, $O_3$, $N_2O$, or $NH_3$. If polish stopping layer 39 is not formed, the thermal treatment restores any damage done to first upper dielectric layer 37.

A second upper dielectric layer 43 is then formed on planarized inter-insulating layer 41. Second dielectric layer 43 is formed of an oxidation material such as $Al_2O_3$, $HfO_2$, $Ta_2O_5$, $La_2O_3$, $SrTiO_3$(ST), $Ba_xSr_{1-x}TiO_3$, $PbZr_xTi_{1-x}O_3$ (PZT), $SrBi_2Ta_2O_5$ or $Zr_2O_3$, silicon nitride (SiN), or oxynitride, and may be formed of at least two stacked layers.

Figure 6:
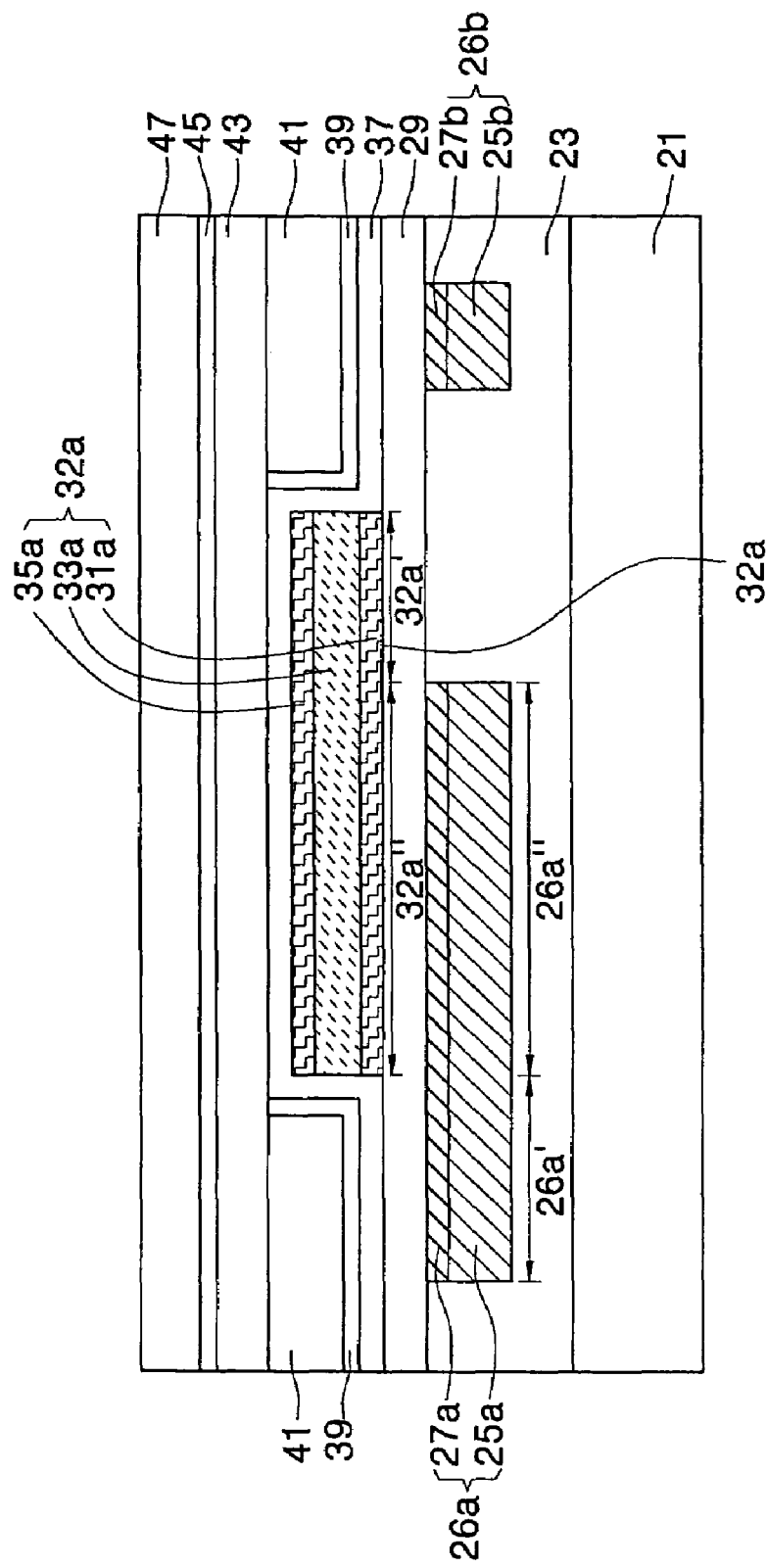

Referring to FIG. 1 and FIG. 6, an upper insulating layer 47 is formed on second dielectric layer 43. Upper insulating layer 47 is preferably formed of low-k dielectric material, and the material may be silicon dioxide ($SiO_2$) or silicon nitride (SiN). Preferably, an etch-stop layer 45 is formed prior to the formation of upper insulating layer 47. Etch-stop layer 45 is formed of $Al_2O_3$.

Figure 7:
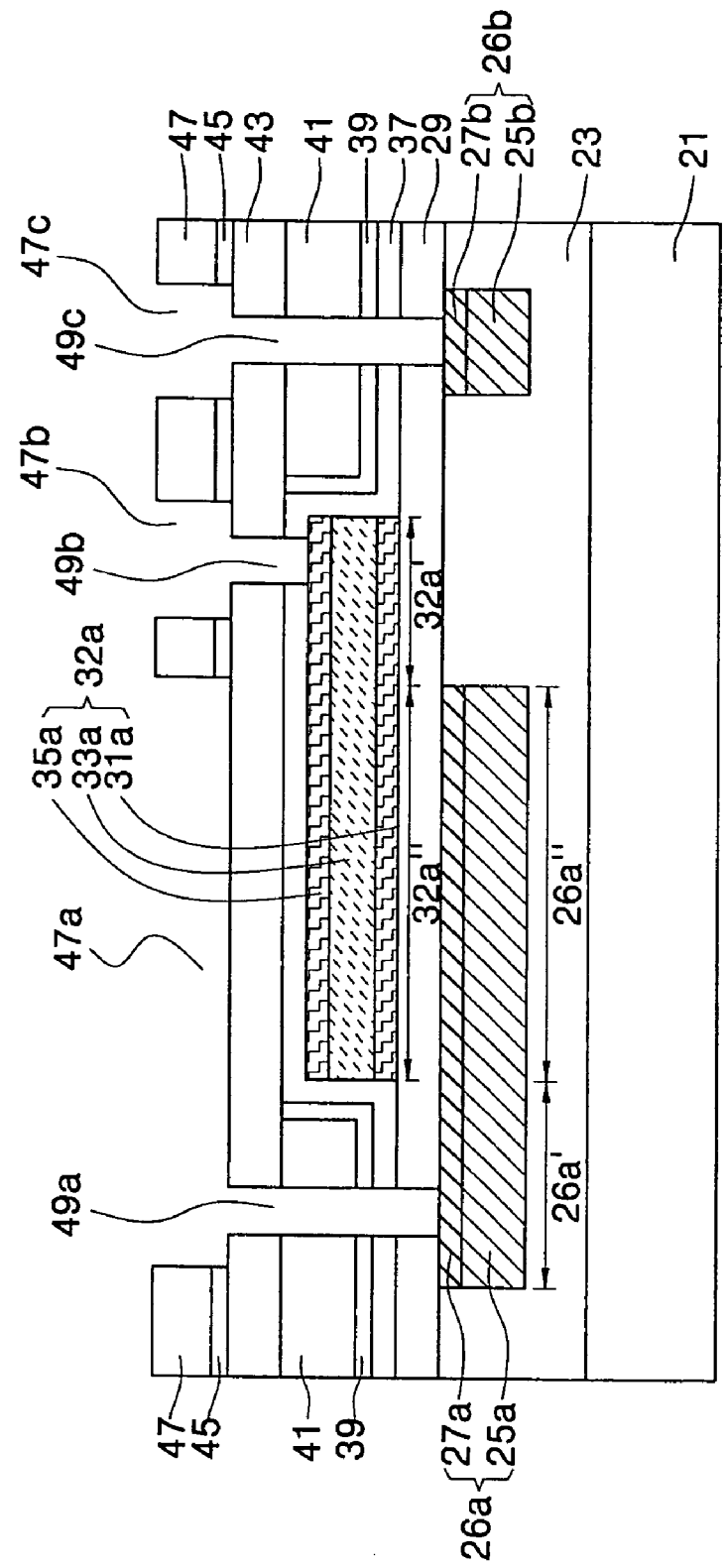

Referring to FIG. 1 and FIG. 7, upper insulating layer 47 is patterned to form trenches 47a, 47b, and 47c, which define a patterned upper plate 51a, an upper interconnection line 51b, and a second upper interconnection line 51c, respectively. A first via hole 49a, a second via hole 49b, and a third via hole 49c may be formed after or prior to the formation of trenches 47a, 47b, and 47c.

Upper insulating layer 47 is patterned using a photolithography process and an etching process. Etch-stop layer 45 prevents second upper dielectric layer 43 from being damaged while upper insulating layer 47 is patterned. Etch-stop layer 45 below trenches 47a, 47b, and 47c is removed by a wet etching process.

Referring to FIG. 1 and FIG. 8, an upper conductive layer is formed in trenches 47a, 47b, and 47c. In addition, the upper conductive layer also fills via holes 49a, 49b, and 49c.

The upper conductive layer is planarized until the upper surface of upper insulating layer 47 is exposed. As a result, a first via 53a, a second via 53b, and a third via 53c are formed within via holes 49a, 49b, and 49c, respectively, and patterned upper plate 51a, first upper interconnection line 51b, and second upper interconnection line 51c are formed and defined within trenches 47a, 47b, and 47c, respectively. In addition, patterned upper plate 51a includes an upper plate 51a". Patterned upper plate 51a may include a third connecting portion 51a' electrically connected to the upper plate 51a". Third via 53c directly and electrically connects lower interconnection line 26b to second upper interconnection line 51c. First via 53a is formed at the same level as third via 53c. Alternatively, as shown in FIG. 1, a third upper interconnection line 51d crossing above first via 53a may be formed at the same level as patterned upper plate 51a. Third upper interconnection line 51d may be a power line to supply voltage to patterned lower and upper plates 26a and 51a.

In accordance with the embodiments of the present invention, patterned upper plate 51a and first upper interconnection line 51b are formed using a damascene process. As a result, a photo process to pattern the upper plate is omitted, which leads to the fabrication of a semiconductor device having a dual stacked MIM capacitor with a reduced number of photomask processes.

FIGS. 9 to 15 are cross-sectional views to illustrate a method of fabricating a semiconductor device having a dual stacked MIM capacitor in accordance with another embodiment of the present invention.

Figure 9:
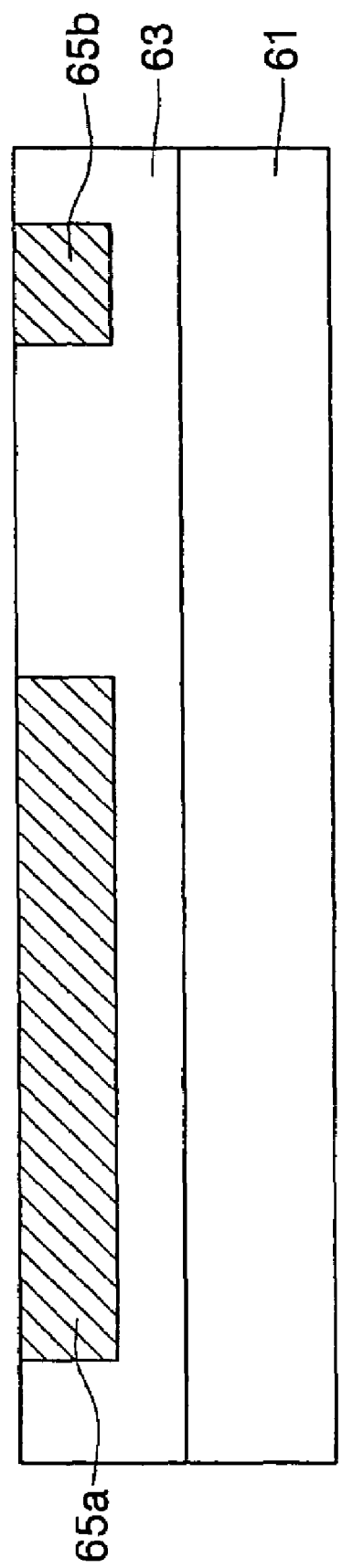
FIGS. 9 to 15 are cross-sectional views to illustrate another method of fabricating a dual stacked MIM capacitor.

Referring to FIG. 9, a lower insulating layer 63, and a patterned lower plate 65a and a lower interconnection line 65b are formed on a semiconductor substrate 61.

Figure 10:
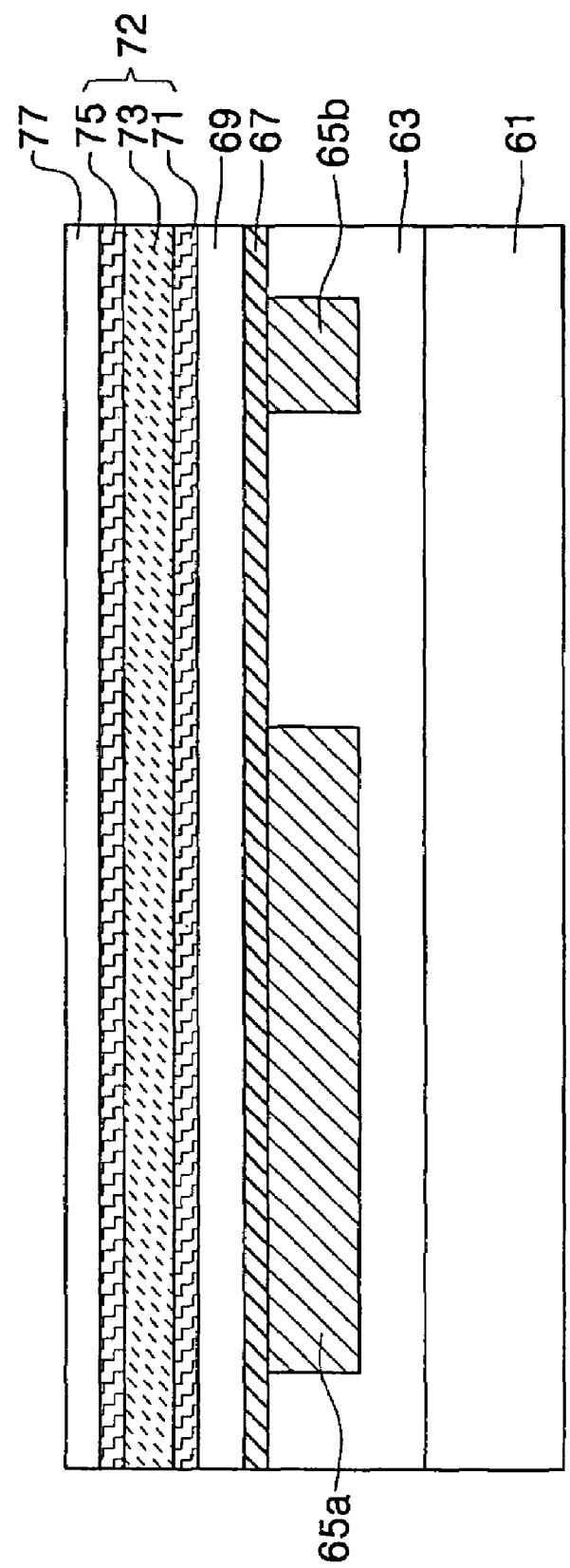

Referring to FIG. 10, a barrier metal layer 67, a lower dielectric layer 69, and an intermediate plate conductive layer 72 are sequentially formed on patterned lower plate 65a and lower interconnection line 65b. Barrier metal layer 67 is preferably a metal nitride layer of TiN, TaN or WN, a ternary compound layer containing Si or Al such as TaSiN or TaAlN, a noble metal layer such as Ir, Pt or Ru, or other layers such as Ti or Ta.

Lower dielectric layer 69 and intermediate plate conductive layer 72 may be formed of the same material as described with reference to FIG. 3.

A hard mask layer 77 is formed on intermediate plate conductive layer 72.

Figure 11:
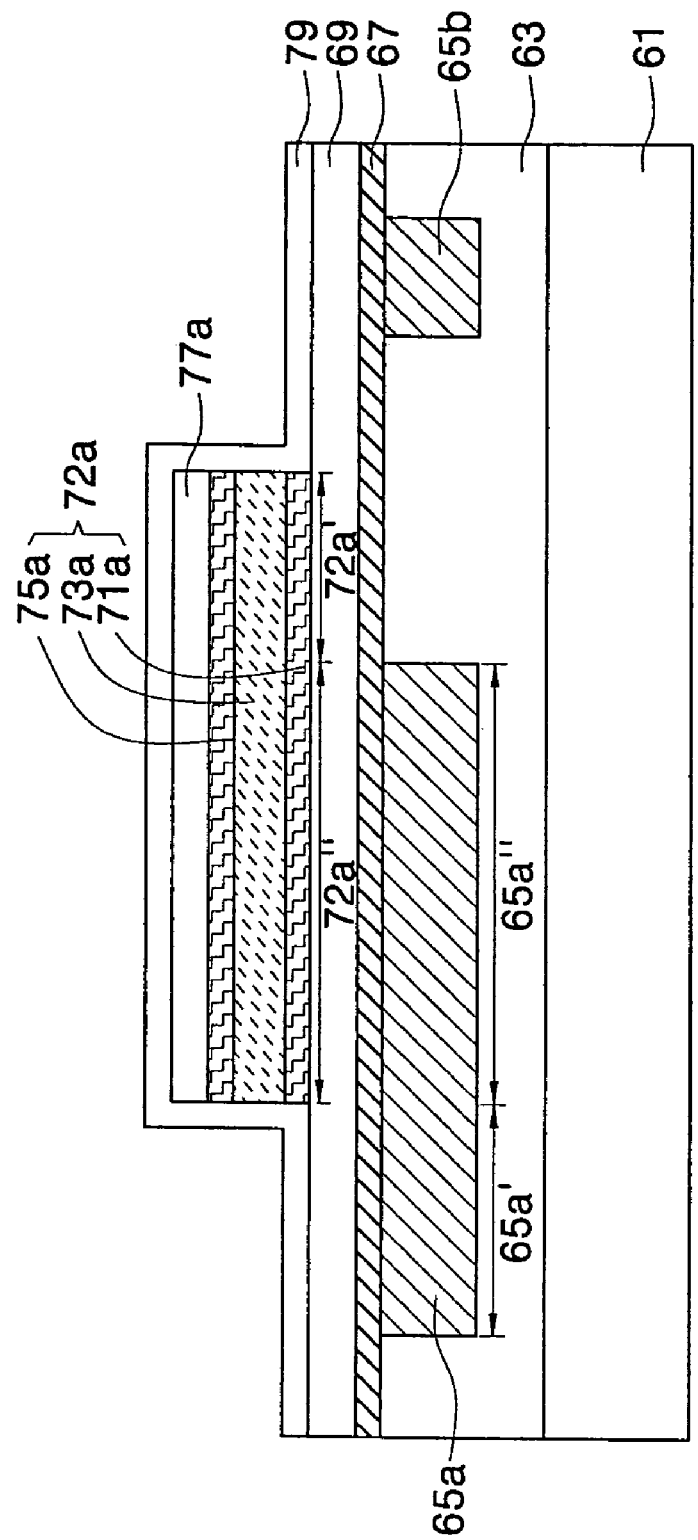

Referring to FIG. 11, hard mask layer 77 is patterned to form a patterned hard mask 77a to define a patterned intermediate plate 72a. Intermediate plate conductive layer 72 is then etched using patterned hard mask 77a as an etch mask to form patterned intermediate plate 72a. Patterned intermediate plate 72a, as described with reference to FIG. 4, is a stacked structure of patterned first, second, and third intermediate plates 71a, 73a, and 75a. After patterned intermediate plate 72a is formed, lower dielectric layer 69 and barrier metal layer 67 are patterned.

Preferably, a spacer insulating layer 79 is formed on patterned intermediate plate 72a. Patterned hard mask 77a may be removed prior to the formation of spacer insulating layer 79. However, it is preferable not to remove patterned hard mask 77a prior to the formation of spacer insulating layer 79.

Figure 12:
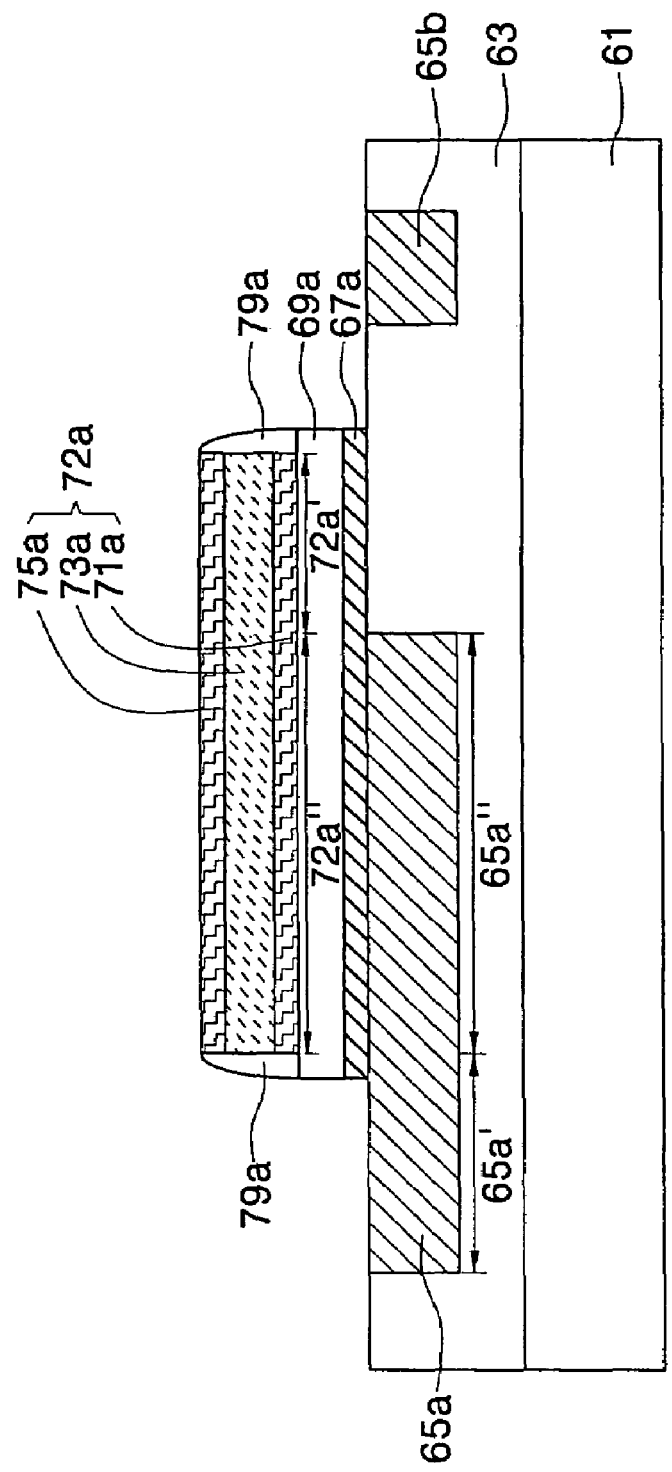

Referring to FIG. 12, spacer insulating layer 79 is etched to form a spacer 79a to cover sidewalls of patterned intermediate plate 72a. Portions of lower dielectric layer 69 and barrier metal layer 67 are etched using spacer 79a and patterned hard mask 77a as an etch mask. As a result, a patterned lower dielectric layer 69a and a patterned barrier metal layer 67a are formed. Patterned hard mask 77a prevents patterned intermediate plate 72a from being etched while lower dielectric layer 69 and barrier metal layer 67 are etched. Patterned hard mask 77a is removed after patterned barrier metal layer 67a is formed.

If patterned hard mask 77a is not used as the etch mask, patterned intermediate plate 72a may be used as the etch mask to etch lower dielectric layer 69 and barrier metal layer 67.

Figure 13:
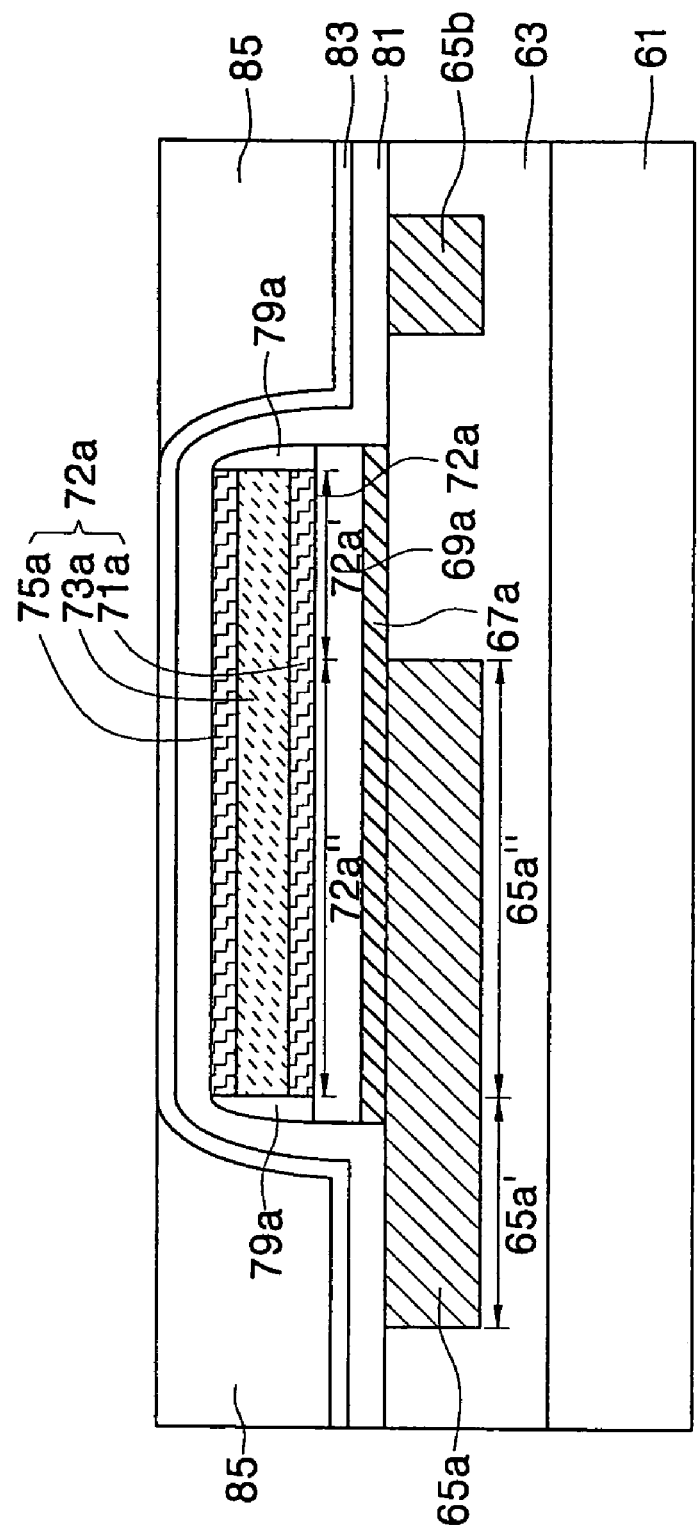

Referring to FIG. 13, an inter-insulating layer 85 is formed on patterned intermediate plate 72a. Inter-insulating layer 85 is preferably formed of low-k dielectric material, however, it may be formed from a material such as silicon dioxide (SiO$_2$) or a silicon nitride (SiN). Inter-insulating layer 85 is then planarized until inter-insulating layer 85 above patterned intermediate plate 72a is removed.

Preferably, a first upper dielectric layer 81 is conformably formed prior to the formation of inter-insulating layer 85. First upper dielectric layer 81 covers an upper portion of patterned intermediate plate 72a and spacer 79a. In addition, first upper dielectric layer 81 covers sidewalls of patterned barrier metal layer 67a and patterned lower dielectric layer 69a, and patterned lower plate 65a and lower interconnection line 65b. First upper dielectric layer 81 prevents metal atoms from diffusing in patterned lower plate 65a and lower interconnection line 65b into inter-insulating layer 85.

As described with reference to FIG. 4, a polish stopping layer 83 may be formed to cover first upper dielectric layer 81. Polish stopping layer 83 protects an upper surface of first upper dielectric layer 81 while inter-insulating layer 85 is planarized. As a result, polish stopping layer 83 above patterned intermediate plate 72a is exposed after inter-insulating layer 85 is planarized.

Figure 14:
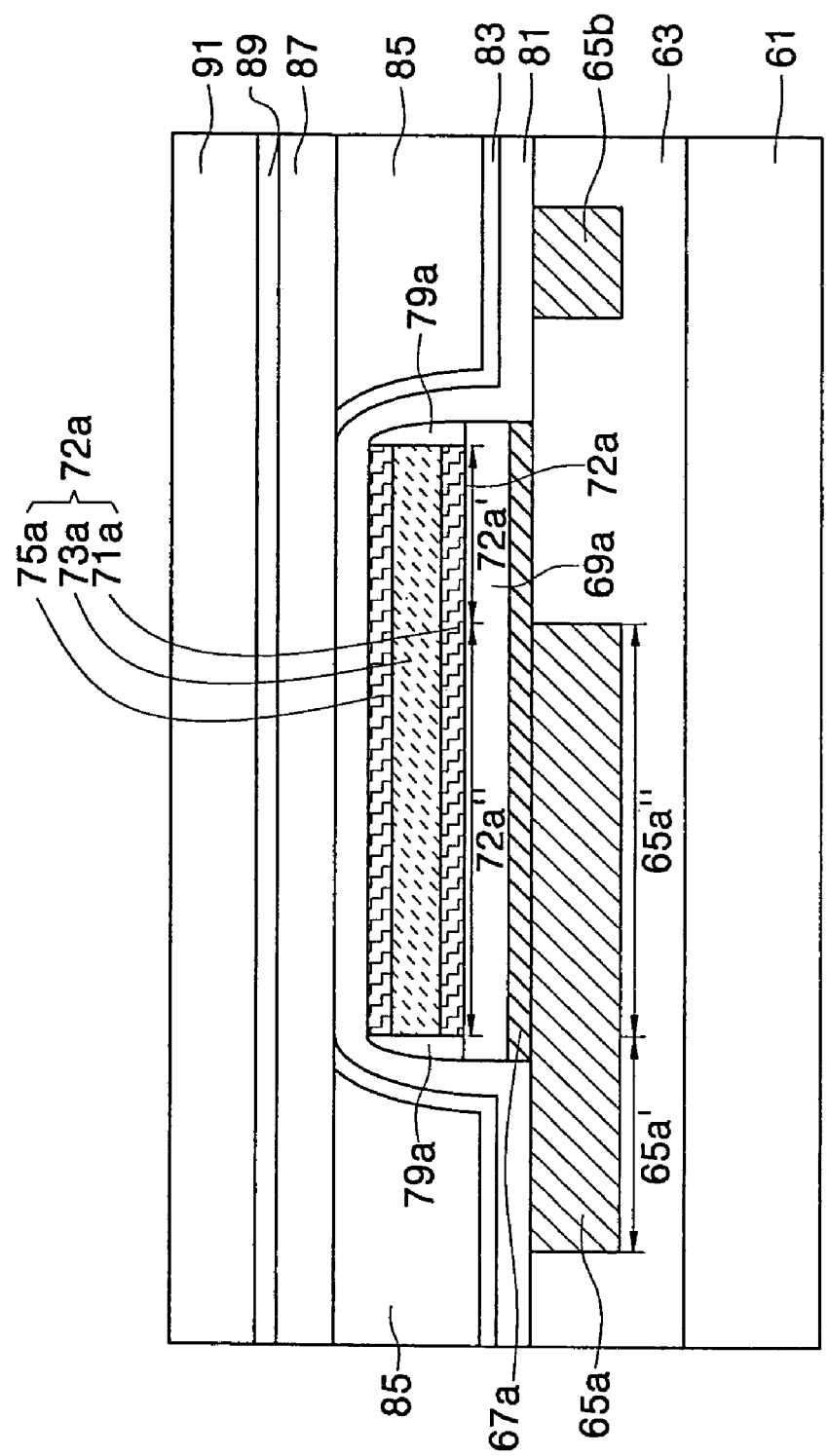

Referring to FIG. 14, as described with reference to FIG. 5, exposed polish stopping layer 83 is removed by a wet etching process. In addition, thermal treatment may be performed on first upper dielectric layer 81. A second upper dielectric layer 87 is then formed on the planarized inter-insulating layer 85.

In addition, as described with reference to FIG. 6, an etch-stop layer 89 and an upper insulating layer 91 are formed on second upper dielectric layer 87.

Referring to FIG. 15, as described with reference to FIG. 7 and FIG. 8, a patterned upper plate 93a, a first upper interconnection line 93b, and a second upper interconnection line 93c are formed within upper insulating layer 91. In addition, a first via 95a to connect patterned upper plate 93a to patterned lower plate 65a, a second via 95b to connect upper interconnection line 93b to patterned intermediate plate 72a, and a third via 95c to connect second upper interconnection line 93c to the lower interconnection line 65b are formed.

In accordance with the second embodiment of the present invention, etch damage may occur on sidewalls of patterned lower dielectric layer 69a while patterned lower dielectric layer 69a and patterned barrier meal layer 67a are formed. However, by means of spacer 79a, the properties of the MIM capacitor are protected from damage due to the etching of patterned lower dielectric layer 69a.

Exemplary embodiments of the present invention have been disclosed herein and, although specific terms are employed, they are used and are to be interpreted in a generic and descriptive sense. Accordingly, it will be understood by those of ordinary skill in the art that various changes in form and details may be made without departing from the scope of the present invention as set forth in the following claims.

What is claimed is:

1. A method of fabricating a semiconductor device, comprising:

forming a lower insulating layer on a semiconductor substrate, forming a patterned lower plate and a lower interconnection line on the lower insulating layer, wherein forming the patterned lower plate comprises forming a first barrier metal layer on the lower insulating layer;

forming a lower dielectric layer on the first barrier metal layer;

forming a patterned intermediate plate on the lower dielectric layer, wherein the patterned intermediate plate comprises a first intermediate plate, a second intermediate plate, and a third intermediate plate;

forming a first upper dielectric layer on the lower dielectric layer;

forming an inter-insulating layer on the first upper dielectric layer;

forming a second upper dielectric layer on the inter-insulating layer and the patterned intermediate plate;

sequentially forming an etch stop layer and an upper insulating layer on the second upper dielectric layer;

patterning the upper insulating layer to form a plurality of trenches;

forming a first via hole to expose the patterned lower plate, a second via hole to expose the patterned intermediate plate, and a third via hole to expose the lower interconnection line; and filling the plurality of trenches and via holes with a conductive material, thereby forming a patterned upper plate electrically connected to the patterned lower plate, a patterned first upper interconnection line electrically connected to the patterned intermediate plate, and a patterned second interconnection line electrically connected to the lower interconnection line.

2. The method of claim 1, further comprising:

forming a polish stopping layer to cover the first upper dielectric layer before forming the inter-insulating layer; and removing the polish stopping layer above the patterned intermediate plate after planarizing the inter-insulating layer.

3. The method of claim 1, wherein the patterned lower plate comprises a first lower metal layer and the first barrier metal layer, and the lower connection line comprises a second lower metal layer and a second barrier metal layer.

4. The method of claim 3, wherein each of the first and second lower metal layers is formed from a metal selected from a group consisting of W, Al and Cu; and, wherein each of the first and second barrier metal layers is formed from a metal selected from a group consisting of TiN, TaN, WN, Si, Al, TaSiN, TaAlN, Ir, Pt, Ru, Ti, and Ta.

5. The method of claim 1, wherein the first and third intermediate plates are each formed from a metal selected from a group consisting of Ta, Ti, TaN, TiN, WN and Ru; and, wherein the second intermediate plate is formed from a metal selected from a group consisting of Al and W.

6. A method of fabricating a semiconductor device, comprising:

forming a lower insulating layer on a semiconductor substrate, forming a patterned lower plate and a lower interconnection line on the lower insulating layer;

forming a barrier metal layer on the patterned lower plate and the lower interconnection line;

forming a lower dielectric layer on the barrier metal layer;

forming a patterned intermediate plate on the lower dielectric layer, wherein the patterned intermediate plate comprises a first intermediate plate, a second intermediate plate, and a third intermediate plate;

forming a spacer insulating layer on the lower dielectric layer and the patterned intermediate plate;

etching the spacer insulating layer to form a spacer on a sidewall of the patterned intermediate plate;

etching the lower dielectric layer and the barrier metal layer by using the spacer as an etch mask to form a patterned lower dielectric layer and patterned barrier metal layer, respectively;

forming a first upper dielectric layer on the spacer, the patterned lower dielectric layer, the patterned barrier metal layer, and the lower insulating layer;

forming an inter-insulating layer on the first upper dielectric layer;

forming a second upper dielectric layer on the inter-insulating layer and the patterned intermediate plate;

sequentially forming an etch stop layer and an upper insulating layer on the second upper dielectric layer;

patterning the upper insulating layer to form a plurality of trenches;

forming a first via hole to expose the patterned lower plate, a second via hole to expose the patterned intermediate plate, and a third via hole to expose the lower interconnection line; and filling the plurality of trenches and via holes with a conductive material, thereby forming a patterned upper plate electrically connected to the patterned lower plate, a patterned first upper interconnection line electrically connected to the patterned intermediate plate, and a patterned second interconnection line electrically connected to the lower interconnection line.

7. The method of claim 6, further comprising:

forming a polish stopping layer to cover the first upper dielectric layer before forming the inter-insulating layer; and removing the polish stopping layer above the patterned intermediate plate after planarizing the inter-insulating layer.

8. The method of claim 6, wherein the first and third intermediate plates are formed from a metal selected from a group consisting of Ta, Ti, TaN, TIN, WN and Ru; and, wherein the second intermediate plate is a formed from a metal selected from a group consisting of Al and W.

* * * * *